US006661731B2

(12) United States Patent
Fujimoto

(10) Patent No.: US 6,661,731 B2
(45) Date of Patent: Dec. 9, 2003

(54) SEMICONDUCTOR MEMORY, SEMICONDUCTOR INTEGRATED CIRCUIT AND SEMICONDUCTOR MOUNTED DEVICE

(75) Inventor: Yukihiro Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 09/962,159

(22) Filed: Sep. 26, 2001

(65) Prior Publication Data

US 2002/0036944 A1 Mar. 28, 2002

(30) Foreign Application Priority Data

Sep. 27, 2000 (JP) ........................................ 2000-295219

(51) Int. Cl.$^7$ ................................................. G11C 8/00
(52) U.S. Cl. ................ 365/230.03; 365/63; 365/230.06
(58) Field of Search ...................... 365/230.03, 230.06, 365/51, 63

(56) References Cited

U.S. PATENT DOCUMENTS 5,831,924 A * 11/1998 Nitta et al. ............. 365/230.03
6,285,623 B1 * 9/2001 Toda ..................... 365/230.03

FOREIGN PATENT DOCUMENTS

JP 2000-57761 2/2000

* cited by examiner

Primary Examiner—Vu A. Le
(74) Attorney, Agent, or Firm—Oblon, Spivak, McClelland, Maier & Neustadt, P.C.

(57) ABSTRACT

A semiconductor memory comprising: a plurality of sub-memory cell arrays each of which is constituted by a plurality of memory cells arranged in a first direction; a memory cell array constituted by the sub-memory cell arrays arranged in the first and a second direction; a plurality of local bit lines in the sub-memory arrays; a plurality of word lines in the sub-memory arrays; a plurality of global bit lines connected the local bit lines via switching circuits; a plurality of read/write circuits connected to the global bit lines; a selecting circuit selecting a first read/write circuits on the basis of a first address signal from a first bus and selecting a second read/write circuits on the basis of a second address signal from a second bus; a sub-memory cell array selecting circuit connected to the switching circuits, decoding the first and second address signals, and selecting a first sub-memory cell array, and a second sub-memory cell array; and an address decoding circuit decoding the first and second address signals, and activating a first word line connected to a memory cell of the first sub-memory cell array and a second word line connected to another memory cell of the second sub-memory cell array.

20 Claims, 9 Drawing Sheets

PRIOR ART

SEMICONDUCTOR MEMORY, SEMICONDUCTOR INTEGRATED CIRCUIT AND SEMICONDUCTOR MOUNTED DEVICE

CROSS-REFERENCE TO RELATED APPLICATION

This application claims benefit of priority under 35 U.S.C. §119 to Japanese Patent Application No. 2000-295,219 filed on Sep. 27, 2000, the entire contents of which are incorporated by reference herein.

BACKGROUND OF THE INVENTION

1. Field of the Invention

This application relates to a semiconductor memory, a semiconductor integrated circuit and a semiconductor mounted device, and more particularly relates to a semiconductor memory which is accessed by a plurality of interfaces, a semiconductor integrated circuit including such a semiconductor memory, and a semiconductor mounted device in which the semiconductor memory is mounted on a system board.

2. Description of the Related Art

A system LSI such as a micro-processor and a graphic LSI is provided with a built-in memory such as a cache memory in order to improve system characteristic thereof. Such memories store a part of data which are stored in a higher order memory connected to a system bus, thereby reducing the number of accesses to data via the system bus, and enabling high speed access to the data.

Referring to FIG. 1 of the accompanying drawings, a built-in memory 103 included in a system LSI 100 is required to have a system bus interface for transmitting and receiving data to and from a higher order memory (not shown), and a CPU interface for transmitting and receiving the data to and from a central processing unit (CPU). The built-in memory 103 has only one port for a system bus 101S and a CPU bus 101C, so that a multiplexer 102 is used for selectively establishing a connection between the system bus interface and the system bus 101S or a connection between the CPU interface and the CPU bus 101C. The multiplexer 102 is activated in response to a selective control command from an arbiter circuit 104.

The data in the built-in memory 103 cannot be accessed by the system bus interface and the CPU bus interface at the same time. If the data are continuously and preferentially accessed by the CPU bus 101C under control of the arbiter circuit 104, the system bus 101S cannot access the data. As a result, the system characteristics of the system LSI 100 will be reduced.

In order to overcome the reduced system characteristics caused by data access collision, the built-in memory 103 is preferably provided with a plurality of banks.

Referring to FIG. 2, a built-in memory 103 includes two memory banks 103B0 and 103B1, each of which has a half of the whole storage capacity. System interfaces of the memory banks 103B0 and 103B1 are respectively connected to a system bus 101S via a multiplexer 102A, which selects the system interface of either the memory bank 103B0 or 103B1 in response to a bank address signal from a system bus address. On the other hand, CPU interfaces of the memory banks 103B0 and 103B1 are connected to a CPU bus 101C via a multiplexer 102B, which selects the CPU interface of either the memory bank 103B0 or 103B1.

The data in the built-in memory 103 shown in FIG. 2 can be accessed by both of the foregoing interfaces so long as different bank address signal are used. Further, even if the data are continuously accessed by one of the foregoing interfaces, they can be also accessed by the other interface with a probability of ½. Therefore, the data are accessible from both of the foregoing interfaces without a long waiting time, which is effective in improving the system characteristics of the system LSI 100.

However, the built-in memory 103 requires the memory banks 103B0 and 103B1 as shown in FIG. 2, which means that a bit width of a memory cell array of the built-in memory 103 is simply doubled. Especially, the system LSI 100 processes signals using a number of bits in order to accelerate a processing operation, so that the built-in memory 103 tends to require more bits. Therefore, it becomes difficult to constitute memory cell arrays in the built-in memory 103. Further, an aspect ratio (i.e. a ratio between a column size and a row size) is increased, which inevitably enlarges the built-in memory 103. The larger the built-in memory 103, the longer the access time of the built-in memory 103.

In the built-in memory 103 having the two-bank structure, the same data bits are present in the memory banks 103B0 and 103B1. As shown in FIG. 3, a data bus wiring 105 is necessary to connect an interface between the memory banks 103B0 and 103B1. The data bus wiring 105 has to be as long as the columns of the memory banks 103B0 and 103B1. As a result, the system LSI 100 should be enlarged in order to house the data bus wiring 105. The access time is inevitably increased due to a wiring delay of the data bus wiring 105.

BRIEF SUMMARY OF THE INVENTION

According to a first aspect of the invention, there is provided a semiconductor memory comprising: a plurality of sub-memory cell arrays each of which is constituted by a plurality of memory cells arranged in a first direction; a memory cell array constituted by the sub-memory cell arrays arranged in the first direction and a second direction traversing the first direction; a plurality of local bit lines connected in parallel to a plurality of the memory cells in the sub-memory arrays; a plurality of word lines connected to the memory cells in the sub-memory arrays; a plurality of global bit lines connected in parallel to the local bit lines in the sub-memory cell arrays arranged in the first direction via switching circuits, and arranged in the second direction; a plurality of read/write circuits connected to the global bit lines, and reading and writing information from and into the memory cells; a selecting circuit selecting a first read/write circuits on the basis of a first address signal from a first bus and selecting a second read/write circuits on the basis of a second address signal from a second bus; a sub-memory cell array selecting circuit connected to the switching circuits, decoding the first and second address signals, and selecting a first sub-memory cell array on a first global bit line connected to the first read/write circuit, and a second sub-memory cell array on a second global bit line connected to the second read/write circuits; and an address decoding circuit decoding the first and second address signals, and activating a first word line connected to a memory cell of the first sub-memory cell array and a second word line connected to another memory cell of the second sub-memory cell array.

In accordance with a second aspect of the invention, there is provided a semiconductor memory comprising: a plurality of sub-memory cell arrays each of which is constituted by a plurality of memory cells arranged in a first direction; a memory cell array constituted by the sub-memory cell arrays arranged in the first direction and a second direction traversing the first direction; a plurality of local bit lines connected in parallel to a plurality of the memory cells in the sub-memory arrays; a plurality of word lines connected to the memory cells in the sub-memory arrays; a plurality of global bit lines extending along the local bit lines in the sub-memory cell arrays arranged in the first direction, and arranged in the second direction; a plurality of switching circuits provided to the global bit lines, and connected to the local bit line of a first global bit line or a second global bit line which is adjacent in the second direction; a plurality of read/write circuits connected to the global bit lines, and reading and writing information from and into the memory cells; a sub-memory cell array selecting circuit connected to the switching circuits, decoding the first and second address signals, and selecting a first sub-memory cell arrays on the first global bit lines connected to a first read/write circuit, and a second sub-memory cell array on the second global bit line connected to a second read/write circuits, or the sub-memory cell array selecting circuit selecting a first sub-memory cell array on the first global bit line, and a second sub-memory cell array on the first global bit line; and an address decoding circuit decoding the first and second address signals, and activating a first word line connected to a memory cell of the first sub-memory cell array and a second word line connected to another memory cell of the second sub-memory cell array.

With a third aspect of the invention, there is provided a semiconductor memory comprising: a plurality of sub-memory cell arrays each of which is constituted by a plurality of memory cells arranged in a first direction; a memory cell array constituted by the sub-memory cell arrays arranged in the first direction and a second direction traversing the first direction; a plurality of local bit lines connected in parallel to a plurality of the memory cells in the sub-memory arrays; a plurality of word lines connected to the memory cells in the sub-memory arrays; a plurality of global bit lines connected in parallel to the local bit lines in the sub-memory cell arrays arranged in the first direction via switching circuits, and arranged in the second direction; a first read/write circuit connected to one end each of the global bit lines, and reading and writing information from and into the memory cells; a second read/write circuit connected to the other end each of the global bit lines, and reading and writing information from and into the memory cells; a first selecting circuit selecting a first one of the read/write circuits on the basis of a first address signal from a first bus; a second selecting circuit selecting a second read/write circuit on the basis of a second address signal from a second bus; a sub-memory cell array selecting circuit connected to the switching circuits, decoding the first and second address signals, and selecting a first sub-memory cell array on a first global bit line connected to the first read/write circuit, and a second sub-memory cell array on a second global bit line connected to the second read/write circuit; and an address decoding circuit decoding the first and second address signals, and activating a first word line connected to a memory cell of the first sub-memory cell array and a second word line connected to another memory cell of the second sub-memory cell array.

According to a fourth aspect of the invention, there is provided a semiconductor integrated circuit comprising: a semiconductor substrate; a central processing unit mounted on the semiconductor substrate; a central processing unit bus connected to the central processing unit and inputting and outputting data; a central processing unit bus address connected to the central processing unit and transmitting a first address signal; and a semiconductor memory of the first, second or third aspects connected to the central processing unit bus and the central processing unit bus address and being connectable to an external system bus and an external system bus address which transmits a second address signal.

In accordance with a fifth aspect of the invention, there is provided a semiconductor mounted device comprising: a system board; a central processing unit mounted on the system board; a main memory mounted on the system board; a central processing unit bus connected to the central processing unit and inputting and outputting data; a central processing unit bus address connected to the central processing unit and transmitting a first address signal; a system bus connected to the main memory and inputting and outputting data; a system bus address connected to the main memory and transmitting a second address signal; and a semiconductor memory of the first, second or third aspects connected to the central processing unit bus, the central processing unit bus address, the system bus and the system bus address and mounted on a system board.

DETAILED DESCRIPTION OF THE INVENTION

The invention will be described with reference to the embodiments of the invention shown on the drawings. Like or corresponding parts are denoted by like or corresponding reference numbers.

(First Embodiment of the Invention)
[System Configuration of Semiconductor Memory]

Figure 4:
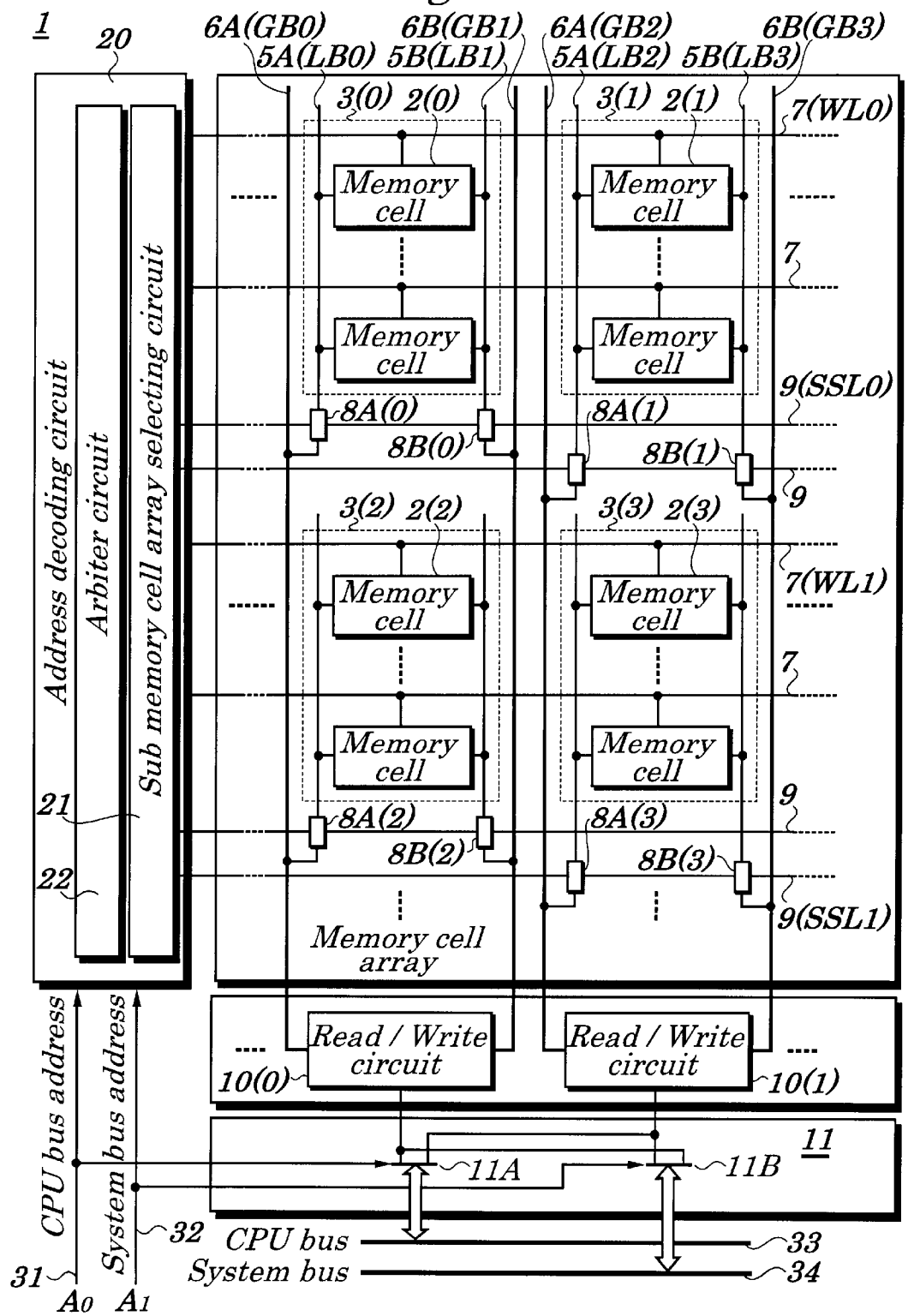
FIG. 4 is a system block diagram of a semiconductor memory according to a first embodiment of the invention.

In a first embodiment, a semiconductor memory 1 comprises the following as shown in FIG. 4: a plurality of sub-memory cell arrays 3 each of which is constituted by a plurality of memory cells 2 arranged in rows (i.e. in a first direction): a memory cell array 4 constituted by the sub-memory cell arrays 3 arranged in the rows and in columns (i.e. in a second direction traversing the first direction) in the shape of a matrix; a pair of local bit lines (LB) 5A and 5B connected in parallel to a plurality of memory cells 2 in the sub-memory cell arrays 3; word lines (WL) 7 connected to memory cells 2 in the sub-memory cell arrays 3; a pair of global bit lines (GB) 6A and 6B connected in parallel to the local bit lines 5A and 5B in the sub-memory cell arrays 3 arranged in the rows via switching circuits 8A and 8B, and arranged in the columns; a plurality of read/write circuits 10 connected to a pair of global bit lines 6A and 6B, and reading and writing information from and into the memory cells 2; a selecting circuit (column selecting circuit) 11 selecting one read/write circuit 10 on the basis of an address signal $A_0$ from a CPU bus address (first bus) 31, and selecting the other read/write circuit 10 on the basis of an address signal $A_1$ from a system bus address (second bus) 32; a sub-memory cell array selecting circuit 21 connected to the switching circuits 8A and 8B, decoding the first and second address signals $A_0$ and $A_1$, and selecting one of the sub-memory cell arrays 3 on the global bit line 6A or 6B connected to one of the read/write circuits 10 and another sub-memory cell array 3 on the global bit line 6A or 6B connected to the other read/write circuit 10; and an address decoding circuit 10 decoding the address signals $A_1$ and $A_1$, and activating one of the word lines 7 connected to a memory cell 2 of one of the sub-memory cell arrays 3 and the other word line 7 connected to another memory cell 2 of another sub-memory cell array 3.

FIG. 4 schematically shows the memory cell array 4 arranged in a column for one bit. This bit is constituted by two memory cells 2 of the sub-memory cell array 3 connected to a pair of global bit lines 6A and 6B which are adjacent in the column. In other words, the bit is constituted by the two memory cells 2 adjacent in the column.

Figure 5:
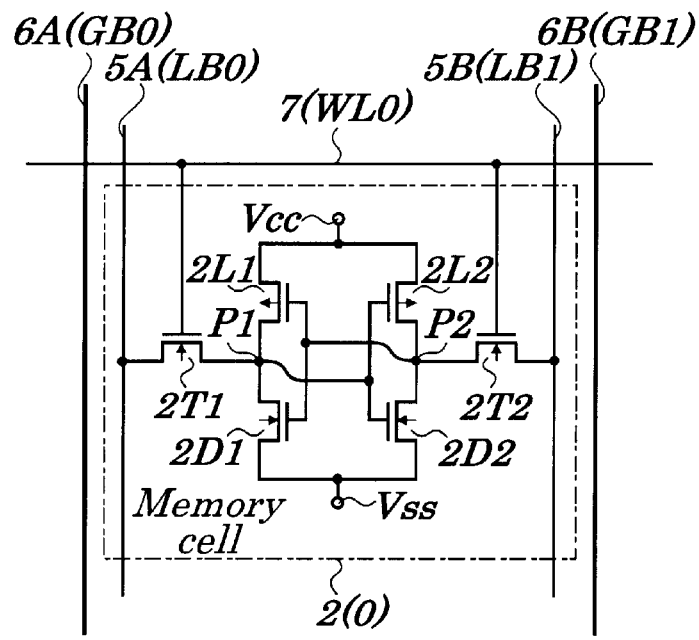
FIG. 5 is a circuit diagram of a memory cell of the semiconductor memory of FIG. 4.

The semiconductor memory 1 is an SRAM (static random access memory) which can operate at an accelerated speed. As shown in FIG. 5, each memory cell 2 is positioned at an intersection of a pair of local bit lines 5A and 5B, which are adjacent each other in the column and extend along a row and to which reverse signal are inputted, and a word line 7. The memory cell 2 includes a flip-flop circuit 200 having a pair of input/output terminals P1 and P2 and storing data, and a first cell selecting transistor 2T1 which connects the input/output terminal P1 to the local bit line 5A and is connected to the word line 7, and a second cell selecting transistor 2T2 which connects the other local bit line 5B and the other input/output terminal P2, and is connected to the word line 7. The cell selecting transistors 2T1 and 2T2 preferably are n-channel IGFETs (insulated gate field effect transistors), which include at least MOSFETs (metal oxide semiconductor field effect transistors) and MISFET (metal insulated semiconductor field effect transistors). Alternatively, the cell selecting transistors 2T1 and 2T2 may be bi-polar transistors.

The flip-flop circuit 200 includes two load transistors 2L1 and 2L2, and two driving transistors 2D1 and 2D2. The load transistor 2L1 is a p channel IGFET in which a source region is connected to a power supply voltage Vcc, a drain region is connected to the input/output terminal P1, and a gate electrode is connected to the input/output terminal P2. The load transistor 2L2 is a p-channel IGFET in which a source region is connected to the power supply voltage Vcc, a drain region is connected to the input/output terminal P2, and a gate electrode is connected to the input/output terminal P1. The power supply voltage Vcc, i.e. a circuit operating voltage, is 1.0 V to 3.3 V, for example. The driving transistor 2D1 is an n channel IGFET in which a source region is connected to a reference voltage Vss, a drain region is connected to the input/output terminal P1 and a gate electrode is connected to the input/output terminal P2. The driving transistor 2D2 is an n-channel IGFET in which a source region is connected to the reference voltage Vss, a drain region is connected to the input/output terminal P2 and a gate electrode is connected to the input/output terminal P1. The reference voltage Vss, i.e. a circuit grounding voltage, is 0 V, for example. In other words, the flip-flop circuit 200 is a complementary IGFET. Alternatively, the flip-flop circuit 200 may be constituted by two load resistance elements, and two driving transistors 2D1 and 2D2.

Referring to FIG. 5, a plurality of memory cells 2 shown in FIG. 4 are arranged in a row which is substantially parallel to a pair of local bit lines 5A and 5B, and form the sub-memory cell array 3. For example, 64 memory cells 2 are arranged in the row in one sub-memory cell array 3 in this example, and four rows of the sub-memory cell arrays 3 are provided in this embodiment, i.e. 256 memory cells 2 are provided. However, the number of memory cells 2 and sub-memory cell arrays 3 are not limited to the foregoing values.

The local bit line 5A of the sub-memory cell array 3 is substantially in parallel to and is electrically connected to the global bit line 6A via the switching circuit 8A. The local bit line 5A of another sub-memory cell array 3 arranged in the row is also connected to the global bit line 6A via the switching circuit 8A. The local bit line 5B is substantially in parallel to and is electrically connected to the global bit line 6B via the switching circuit 8B. The local bit line 5B of another sub-memory cell array 3 arranged in the row is also connected to the global bit line 6B via the switching circuit 8B. The semiconductor memory 1 adopts a hierarchical bit line structure in which the global bit lines 6A and 6B are in parallel to and are electrically connected to the local bit lines 5A and 5B of a plurality of sub-memory cell arrays 3 via the switching circuits 8A and 8B.

One end each of each pair of the global bit lines 6A and 6B is connected to each of read/write circuits 10 which are arranged along the global bit lines 6A and 6B in the column. In other words, the read/write circuits 10 are positioned in a column along a lower side of the memory cell array 3.

The selecting circuit 11 is provided at the lower side of the memory cell array 4 with the read/write circuits 10 interposed therebetween. The selecting circuit 11 selects two read/write circuits 10 connected to two pairs of the global bit lines 6A and 6B which are adjacent in the column and constitute one bit, and includes multiplexing circuits 11A and 11B arranged in a column. The multiplexing circuit 11A is connected to the CPU bus address 31 and connects one of the read/write circuits 10 to the CPU system bus 33 in response to the address signal $A_0$ from the CPU bus address 31. The multiplexing circuit 11B is connected to the system bus address 32 and connects the other read/write circuit 10 to the system bus 34 in response to the address signal $A_1$ from the system bus address 32. In short, the semiconductor memory 1 includes two ports for the CPU bus 33 and the system bus 34, respectively.

Figure 6:
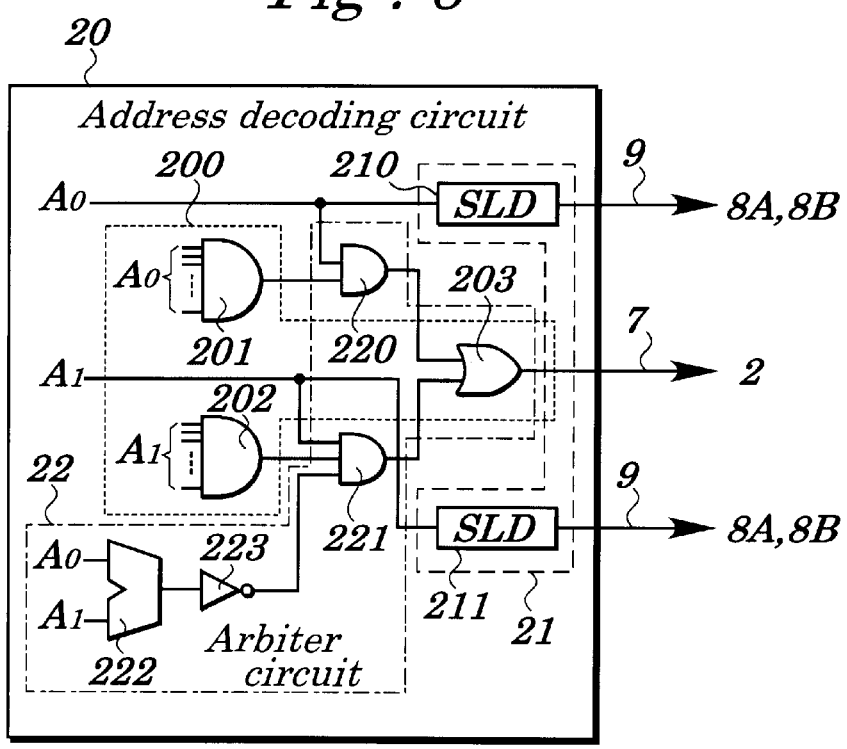
FIG. 6 is a block diagram of an address decoding circuit which constitutes the semiconductor memory and includes a sub-memory cell array selecting circuit and an arbiter circuit.

An address decoding circuit 20 is connected to an end of one of the word lines 7 (the leftmost word line 7 shown in FIG. 4) which are provided for groups of the memory cells 2 in the row, i.e. is positioned along the left side of the memory cell array 4. As shown in FIG. 6, the address decoding circuit 20 is constituted by a group of address decoding unit circuits 200 provided for each word line 7. Each address decoding unit circuit 200 includes decoding circuits 201 and 202 for decoding the address signals $A_0$ and $A_1$ from the CPU bus address 31 and the system bus address 32, and a word line driving circuit 203 for selecting a word line 7 on the basis of logical addition (OR) of an output of the decoding circuit 201 and 202.

The sub-memory cell array selecting circuit 21 is electrically connected to the switching circuits 8A and 8B (arranged in the column) via sub-memory cell selecting signal lines 9, which are substantially in parallel to the word lines 7. Referring to FIG. 4, the sub-memory cell array selecting circuit 21 is positioned along the left side of the memory cell array 4 and is assembled in the address decoding circuit 20. The sub-memory cell array selecting circuit 21 includes at least selection signal line driving circuits 210 and 211 for activating the sub-memory cell array selecting signal lines 9 in response to the address signals $A_0$ and $A_1$ from the CPU bus address 31 and the system bus address 32, respectively.

Although not shown in detail in FIG. 4, the switching circuit 8A is an IGFET in which either a source or drain region is connected to the local bit line 5A and to the global bit line 6A, and a gate electrode is connected to the sub-memory cell selecting signal line 9. The switching circuit 8B is an IGFET in which either a source or drain region is connected to the local bit line 5B and to the global bit line 6B, and a gate electrode is connected to the sub-memory cell selecting signal line 9.

The semiconductor memory 1 further includes the arbiter circuit 22 as shown in FIG. 4 and FIG. 6, which is positioned along the left side of the memory cell array 4 and is assembled in the address decoding circuit 20, similarly to the sub-memory cell array selecting circuit 21. Referring to FIG. 6, the arbiter circuit 22 includes at least: an AND circuit 220 for outputting a logical multiplication (AND) of the address signal $A_0$ from the CPU bus address 31 and an output of the decoding circuit 201 of the address decoding circuit 20; a comparator 222 for comparing the address signal $A_0$ and the address signal $A_1$ (from the system bus address 32); an inverter 223 for reversing the output of the comparator 222; an AND circuit 221 for outputting an AND of the address signal $A_1$, an output of the decoding circuit 202 and an output of the inverter 223; and the word line driving circuit 203 of the address decoding circuit 20 in order to output an AND of outputs of the AND circuits 220 and 221.

The arbiter circuit 22 selects only a sub-memory cell array 3 in response to the address signal $A_0$ when the same sub-memory cell array 3 is selected in response to both the address signals $A_0$ and $A_1$. On the other hand, if different sub-memory cell arrays 3 are selected in response to the address signal $A_0$ and $A_1$, these sub-memory cell arrays 3 are selected by the arbiter circuit 22.

[Data Writing and Reading in Semiconductor Memory]

The following describe how data are written into and read from the semiconductor memory 1 as shown in FIG. 4 to FIG. 6. It is assumed here that the data are written into and read from the memory cell 2(0) in response to the address signal $A_0$ from the CPU bus address 31, and that the data are written into and read from the memory cell 2(3) in response to the address signal $A_1$ from the system bus address 32. Further, these data writing and reading are simultaneously performed.

(1) Data Writing

First of all, the address signal $A_0$ is inputted into the decoding circuit 201 of the address decoding circuit 20 from the CPU bus address 31 while the address signal $A_1$ is inputted into the decoding circuit 202 from the system bus address 32. At the same time, the address signal $A_0$ is inputted into the AND circuit 220 of the arbiter circuit 22, and both the address signals $A_0$ and $A_1$ are inputted into the comparator circuit 222 of the arbiter circuit 22.

When the address signal $A_0$ selects the memory cell 2(0) while the address signal $A_1$ selects the memory cell 2(3), the arbiter circuit 22 judges that both of the memory cells 2(0) and 2(3) have different addresses and are accessible. Therefore, the arbiter circuit 22 activates the word line 7 (WL0) connected to the memory cell 2(0) using the word line driving circuit 203 of the address decoding circuit 20 (and the arbiter circuit 22), and activates the word line 7 (WL1) connected to the memory cell 2(3).

Further, the address signals $A_0$ and $A_1$ are also inputted into the sub-memory cell array selecting circuit 21. In response to the address signal $A_0$, the sub-memory cell array selecting circuit 21 selects the sub-memory cell array selecting signal line 9 (SSL0), activates the switching circuits 8A(0) and 8B(0), connects the local bit line 5A(LB0) and the global bit line 6A(GB0), connects the local bit line 5B(LB1) and the global bit line 6B (GB1), and activates the sub-memory cell array 3(0). In short, the memory cell 2(0) of the sub-memory cell array 3(0) is connected to the read/write circuit 10(0) via the local bit lines 5A (LB0) and 5B (LB1) and the global bit lines 6A(GB0) and 6B(GB1).

In response to the address signal $A_1$, the sub-memory cell array selecting circuit 21 selects the sub-memory cell array selecting signal line 9 (SSL1), activates the switching circuits 8A(3) and 8B(3), connects the local bit line 5A(LB2) and the global bit line 6A (GB2), connects the local bit line 5B(LB3) and the global bit line 6B (GB3), and activates the sub-memory cell array 3(3). In short, the memory cell 2(3) of the sub-memory cell array 3(3) is connected to the read/write circuit 10(1) via the local bit lines 5A (LB2) and 5B (LB3) and the global bit lines 6A(GB2) and 6B(GB3).

Further, the address signals $A_0$ and $A_1$ are inputted into the selecting circuit 11. In the selecting circuit 11, the multiplexing circuit 11A connects the read/write circuit 10(0) and the CPU bus 33 in response to the address signal $A_0$, while the multiplexing circuit 11B connects the read/write circuit 10(1) and the system bus 34 in response to the address signal $A_1$.

The data are transferred from the CPU bus 33, and written by the read/write circuit 10(0) into to the memory cell 2(0) of the sub-memory cell array 3(0). In addition, the data are transferred from the system bus 34, and written by the read/write circuit 10(1) into to the memory cell 2(3) of the sub-memory cell array 3(3).

The data are simultaneously written into the memory cells 2(0) and 2(1) of the sub-memory cell arrays 3(0) and 3(1) as described above.

(2) Data Reading

The data are read as follows. The memory cell 2(0) of the sub-memory cell array 3(0) is selected. The data stored in the memory cell 2(0) are read and amplified by the read/write circuit 10(0). Then, the data are transferred to the CPU bus 33 via the multiplexing circuit 11A of the selecting circuit 11. At the same time, the memory cell 2(3) of the sub-memory cell array 3(3) is selected. The data stored in the memory cell 2(3) are read and amplified by the read/write circuit 10(1). Then, the data are transferred to the system bus 34 via the multiplexing circuit 11B of the selecting circuit 11.

(3) Accessing the Same Memory Cell in Response to Address

When both the address signals $A_0$ and $A_1$ selects the same memory cell 2 of the same sub-memory cell array 3, the memory cell 2 is preferentially selected by the arbiter circuit 22 in response to the address signal $A_0$ from the CPU bus address 31, and the data are written into and read from the selected memory cell 2.

In the semiconductor memory 1, the memory cells 2 are simultaneously selected in response to the address signal $A_0$ from the CPU bus address 31 and the address signal $A_1$ from the system bus address 32, so that the data can be written into and read from the memory cells 2 having different addresses in the memory cell array 4.

Figure 1:
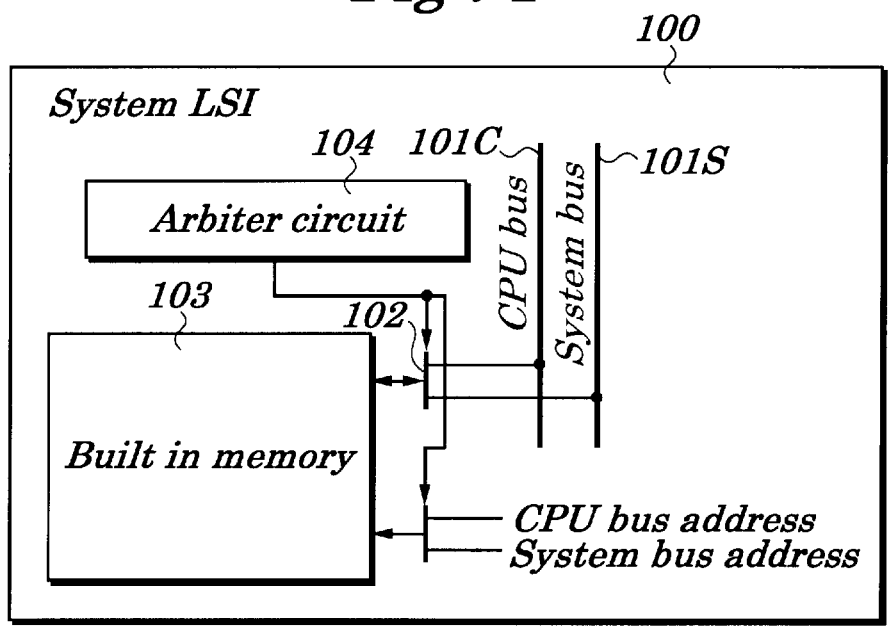
FIG. 1 is a block diagram of a first system LSI of the related art.
Figure 2:
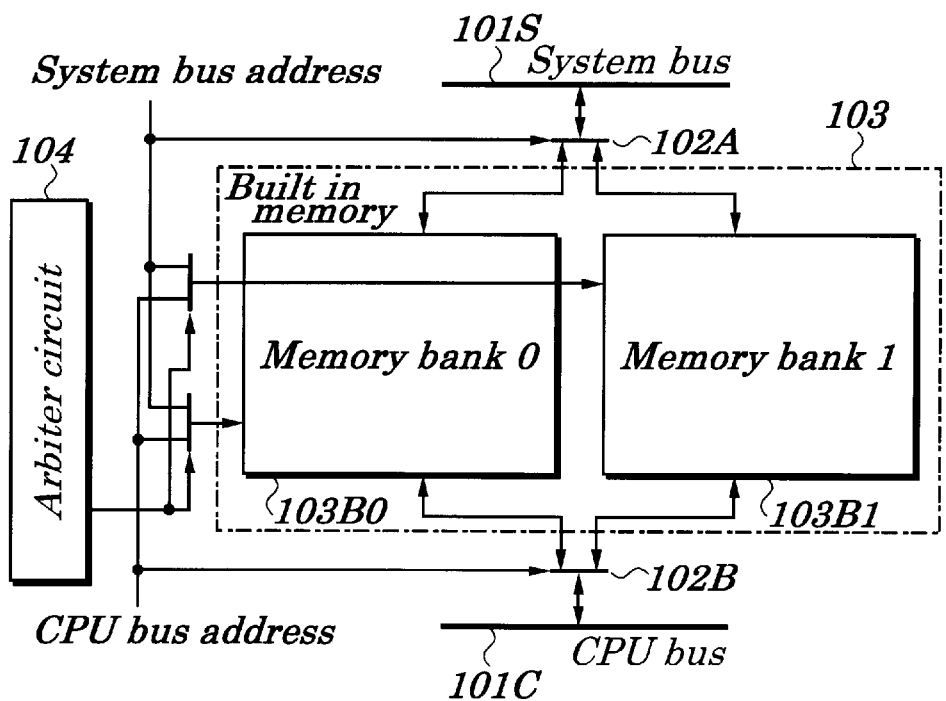
FIG. 2 is a block diagram of a second system LSI of the related art.
Figure 3:
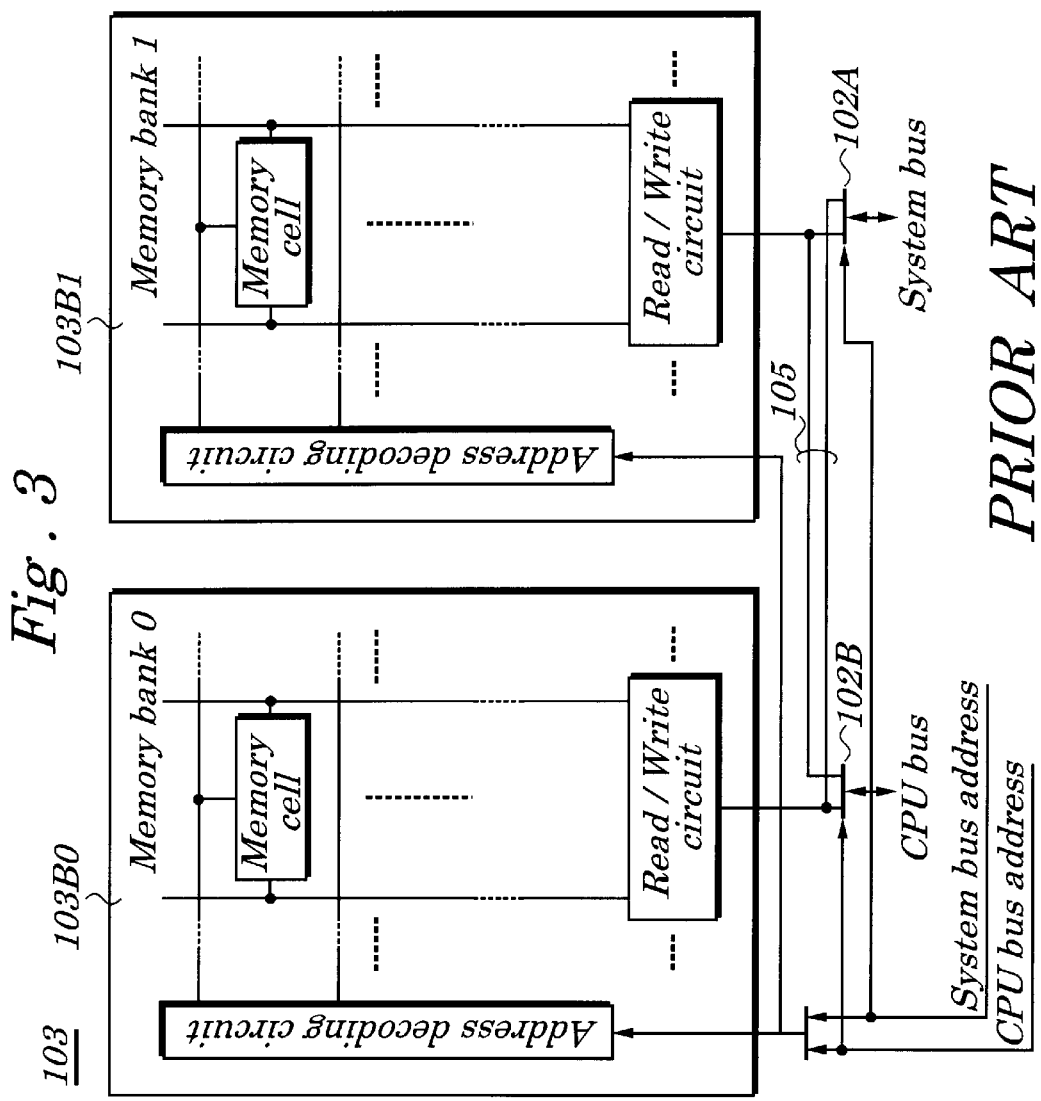
FIG. 3 is a block diagram of the second system LSI, showing a memory included therein and peripheral elements thereof.

According to the first embodiment, two pairs of global bit lines 6A and 6B which are adjacent in one column have the same bit. The data on the CPU bus 33 are transferred using one pair of global bit lines 6A and 6B, and the data on the system bus 34 are transferred using the other pair of global bit lines 6A and 6B. It is not necessary to use the long data bus line 105 for connecting an interface between the memories 103B0 and 103B1 as shown in FIG. 3. Therefore, the semiconductor memory 1 has a reduced area because of the lack of the data bus line 105. Further, it is possible to accelerate the data transfer since no wiring delay is caused.

[System Configuration of Semiconductor Integrated Circuit]

A semiconductor integrated circuit 40 is constituted by the semiconductor memory 1 used as a cache memory or the like and a CPU 42, both of which are integrated on a semiconductor chip. The semiconductor integrated circuit 40 comprises: a semiconductor substrate 41; the CPU 42 mounted on the semiconductor substrate 41; the CPU bus 33 connected to the CPU 42 and inputting and outputting data; the CPU bus address 31 connected to the CPU 42 and transmitting the address signal $A_0$; and the semiconductor memory 1 connected to the CPU bus 33 and the CPU bus address 31 and being connectable to an external system bus 34 and an external system bus address 32 which transmits the address signal $A_1$.

The semiconductor substrate 41 is preferably a silicon single crystal substrate, a III-V group compound semiconductor substrate or the like.

At least, a main memory 43 such as a RAM (random access memory), a ROM (read only memory), a hard disc (a magnetic memory) or the like is connected to the external system bus 34 and the external system bus address 32. Further, other semiconductor integrated circuits or peripheral units may be connected to the external system bus 34 and the external system bus address 32.

The semiconductor integrated circuit 40 is also provided with a system LSI (large scale integrated circuit) such as a micro processor or a graphic LSI.

The semiconductor integrated circuit 40 has the semiconductor memory 1 as a built-in memory and the CPU 42 both of which are integrated on the semiconductor substrate 41. Therefore, the semiconductor integrated circuit 40 can assure the advantages attained by the semiconductor memory 1 itself, and enable the address signal $A_0$ to be transferred by the CPU bus address 31 between the semiconductor memory 1 and the CPU 42 at an accelerated speed, and enable the data to be transferred by the CPU bus address 33 at an accelerated speed.

[System Configuration of Semiconductor Mounted Device]

Figure 8:
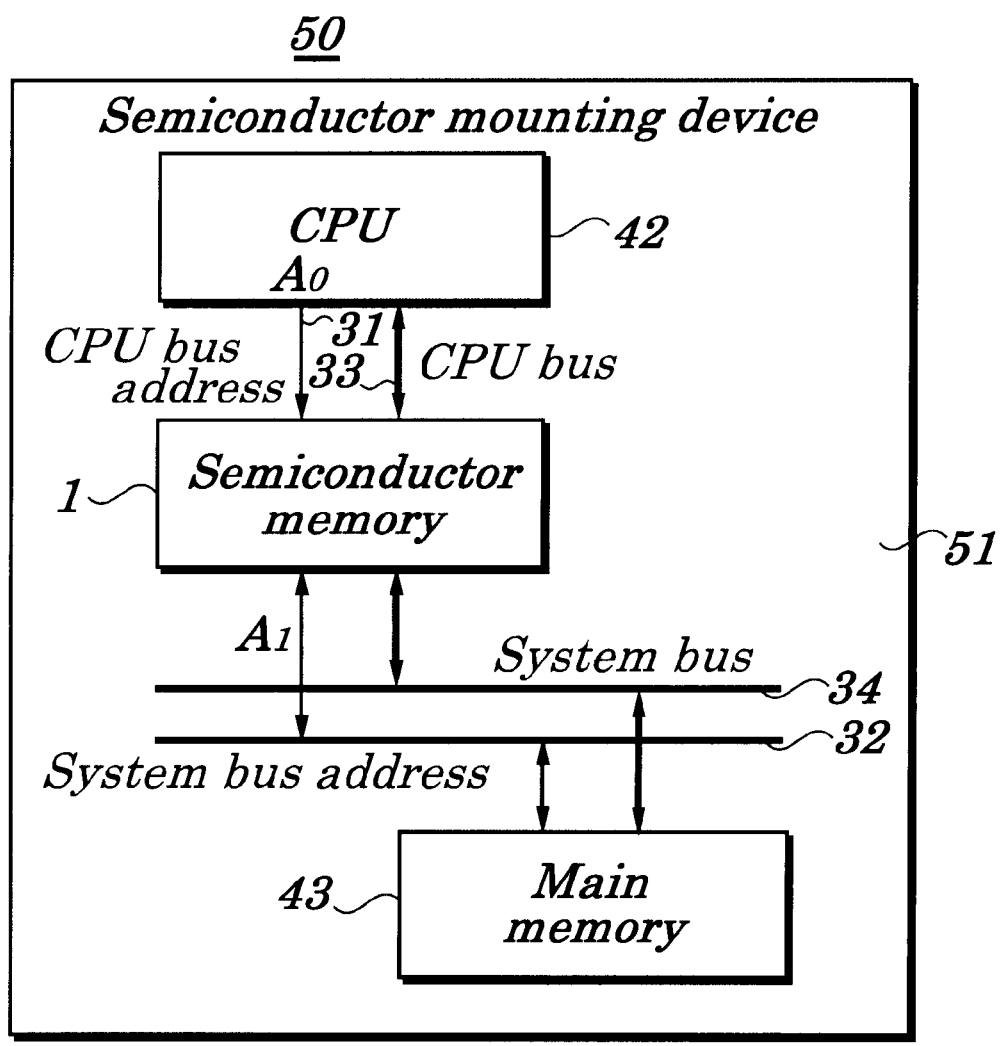
FIG. 8 is a block diagram of a semiconductor mounted device including the semiconductor memory of the first embodiment (or the semiconductor integrated circuit).

Referring to FIG. 8, a semiconductor mounted device 50 includes a semiconductor memory 1 as a single memory device such as a cache memory, which is integrated on a system board 51 together with a CPU 42 and a main memory 43. Specifically, the semiconductor mounted device 50 includes: the system board 51; the CPU 42 mounted on the system board 51; the main memory 43 mounted on the system board 51; the CPU bus 33 connected to the CPU 42 and inputting and outputting data; the CPU bus address 31 connected to the CPU 42 and transmitting the address signal $A_0$; the system bus 34 connected to the main memory 43 and inputting and outputting data; the system bus address 32 connected to the main memory 43 and transmitting the address signal $A_1$; and the semiconductor memory 1 connected to the CPU bus 33, the CPU bus address 31, the system bus 34 and the system bus address 32 and mounted on the system board 51.

The system board 51 is at least a mother board, a daughter board, a baby board, a CPU board, a graphic board or the like, and is preferably made of an epoxy group resin, a polyimide group resin, a silicon single crystal, a compound semiconductor, glass, ceramics, silicon carbide or the like.

In the semiconductor mounted device 50, the CPU 42, semiconductor memory 1 and main memory 43 are treated as one electronic component, and is mounted on the system board 51. Alternatively, the semiconductor mounted device 50 may be constituted by the semiconductor integrated circuit 40 (shown in FIG. 7) mounted on the system board 51 in place of the CPU 42 and the main memory 1 shown in FIG. 8. In the semiconductor integrated circuit 40, the CPU 42 and the semiconductor memory 1 are integrated and mounted on the system board 51.

Therefore, the advantages of the semiconductor memory 1 itself are reflected on the semiconductor mounted device 50, which can accelerate its system operation.

(Second Embodiment of the Invention)

The following describe a semiconductor memory 1, a semiconductor integrated circuit 40 and a semiconductor mounted device 50 according to a second embodiment of the invention. In the semiconductor memory 1, switching circuits 8A and 8B also function as a selecting circuit 11.

[System Configuration of Semiconductor Memory]

Figure 9:
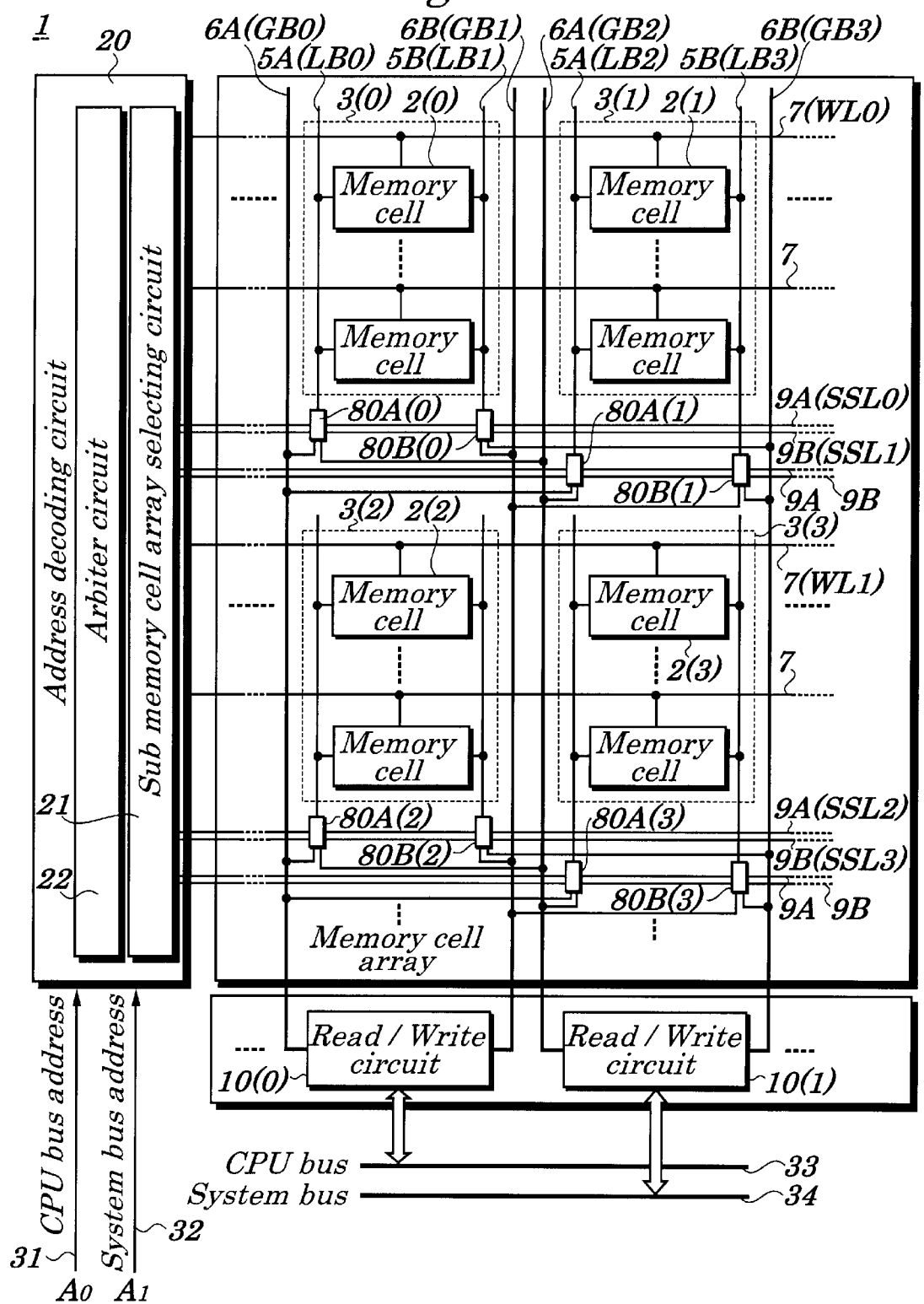
FIG. 9 is a block diagram of a semiconductor memory according to a second embodiment of the invention.

Referring to FIG. 9, the semiconductor memory 1 comprises: a plurality of sub-memory cell arrays 3 each of which is constituted by a plurality of memory cells 2 arranged in a row; a memory cell array 4 constituted by the sub-memory cell arrays 3 arranged in the row and column; a pair of local bit lines 5A and 5B electrically connected in parallel to a plurality of the memory cells 2 in the sub-memory arrays 3; a plurality of word lines 7 connected to the memory cells 2 in the sub-memory arrays 3; a pair of global bit lines 6A and 6B extending along the local bit lines 5A and 5B in the sub-memory cell arrays 3 arranged in a row, and arranged in the column; a plurality of switching circuits 80A and 80B provided for pairs of global bit lines 6A and 6B connected to a pair of local bit lines 5A and 5B which associated with the pair of global bit lines 6A and 6B, or other global bit lines 6A and 6B which are adjacent in the column; a plurality of read/write circuits 10 connected to a pair of the global bit lines 6A and 6B, and reading and writing information from and into the memory cells 2; a sub-memory cell array selecting circuit 21 connected to the switching circuits 80A and 80B, decoding the address signals $A_0$ and $A_1$, selecting one of the sub-memory cell arrays 3 on a pair of the global bit lines 6A and 6B connected to one of the read/write circuits 10, and selecting another sub-memory cell array 3 on another pair of global bit lines 6A and 6B connected to the other read/write circuit 10, or the sub-memory cell array selecting circuit 21 selecting one of the sub-memory cell arrays 3 on a pair of the global bit lines 6A and 6B, and selecting another sub-memory cell array on the same global bit lines 6A and 6B; and an address decoding circuit 20 decoding the address signals $A_0$ and $A_1$, and activating a word line 7 connected to a memory cell 2 of a sub-memory cell array 3 and another word line 7 connected to another memory cell 2 of another sub-memory cell array 3.

The read/write circuit 10 connected to a pair of global bit lines 6A and 6B out of two pairs thereof per bit is connected to the CPU bus 33. The read/write circuit 10 connected to the other pair of global bit lines 6A and 6B is connected to the system bus 34. In short, the read/write circuits 10 are alternately connected to the CPU bus 33 and the system bus 34.

Figure 10:
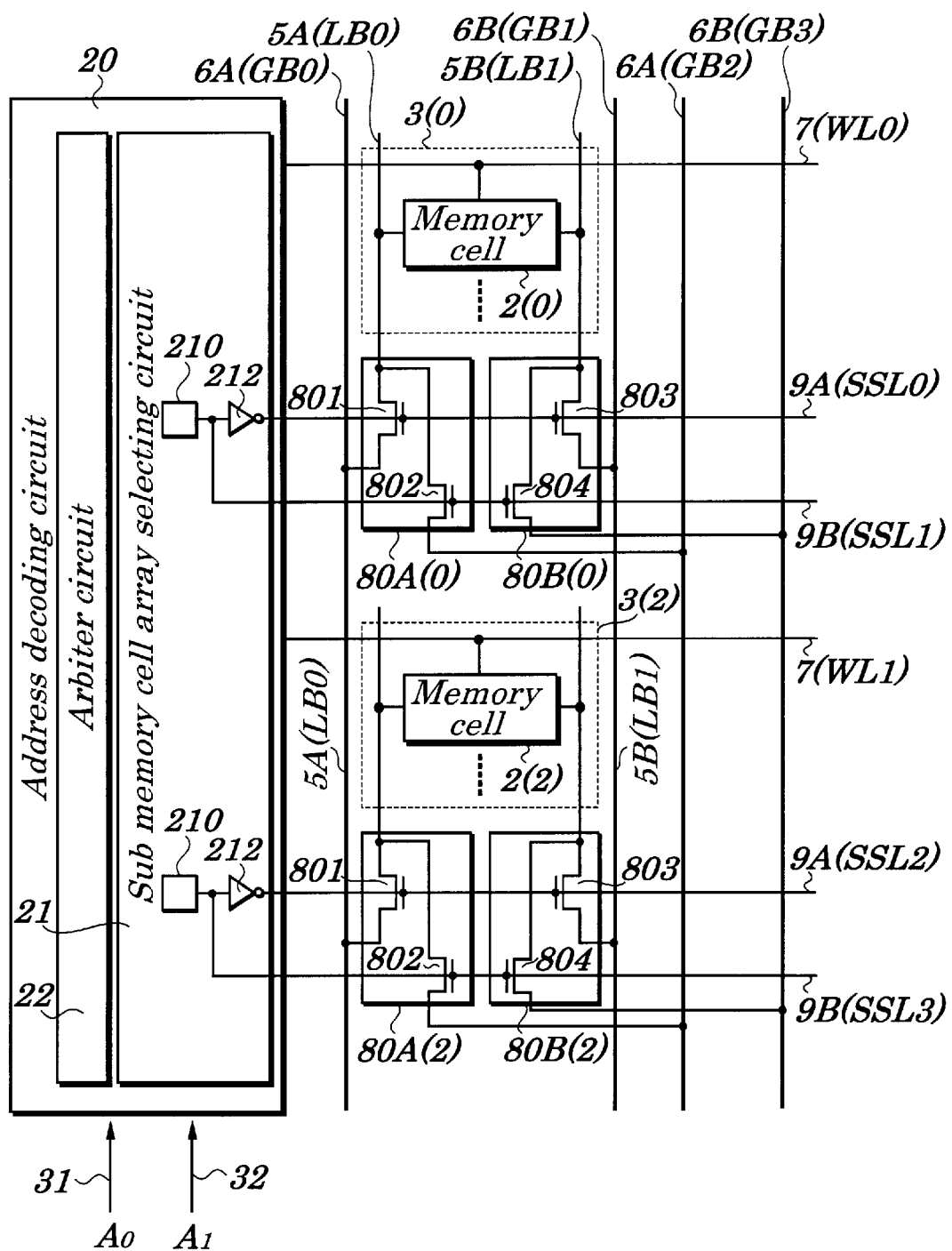
FIG. 10 is a circuit diagram of a switching circuit of the semiconductor memory of FIG. 9.

Referring to FIG. 10, the switching circuit 80A includes two switching transistors 801 and 802 which are n-channel IGFETs, for example. In the switching transistor 801, a source or drain region is connected to the local bit line 5A (LB0), the drain or source region is connected to the global bit line 6A(GB0) associated with the local bit line 5A(LB0), and a gate electrode is connected to the sub-memory cell array signal selecting line 9A. In the switching transistor 802, a source or drain region is connected to the local bit line 5A (LB0), the drain or source region is connected to the global bit line 6A(GB2) which is adjacent to the global bit line 6A(GB0) in the column, and a gate electrode is connected to the sub-memory cell array signal selecting line 9B.

The switching circuit 80B includes two switching transistors 803 and 804. In the switching transistor 803, a source or drain region is connected to the local bit line 5B (LB1), the drain or source region is connected to the global bit line 6B(GB1) associated with the local bit line 5B(LB1), and a gate electrode is connected to the sub-memory cell array signal selecting line 9A. In the switching transistor 804, a source or drain region is connected to the local bit line 5B (LB1), the drain or source region is connected to the global bit line 6B(GB3) which is adjacent to the global bit line 6B (GB1) in the column, and its gate electrode is connected to the sub-memory cell array signal selecting line 9B.

The sub-memory cell array selecting signal lines 9A and 9B are connected to the sub-memory cell array selecting circuit 21. An inverter circuit 212 is provided between a selection signal line driving circuit 210 (or 211) of the sub-memory cell array selecting circuit 21 and the sub-memory cell array selecting signal line 9A. Different selection signals are inputted into the sub-memory cell array selecting signal lines 9A and 9B in order to selectively actuate the switching transistors 801 to 804.

The semiconductor memory 1 of the second embodiment is substantially identical to the semiconductor memory 1 of the first embodiment except for the foregoing features.

[Data Writing and Reading in Semiconductor Memory]

The following describe how data are written into and read from the semiconductor memory 1 as shown in FIG. 9 and FIG. 10. It is assumed here that the data are written into and read from the memory cell 2(0) via a pair of global bit lines 6A(GB0) and 6B(GB1) in response to the address signal $A_0$ from the CPU bas address 31, and that the data are written into and read from the memory cell 2(2) in response to the address signal $A_1$ from the system bus address 32. Further, these data writing and reading are simultaneously performed.

(1) Data Writing

First of all, the address signal $A_0$ is inputted into the address decoding circuit 20 from the CPU bus address 31 while the address signal $A_1$ is inputted into the decoding circuit 20 from the system bus address 32. At the same time, both the address signals $A_0$ and $A_1$ are inputted into the arbiter circuit 22.

When the address signal $A_0$ selects the memory cell 2(0) while the address signal $A_1$ selects the memory cell 2(2), the arbiter circuit 22 judges that both of the memory cells 2(0) and 2(2) have different addresses and are accessible. Therefore, the arbiter circuit 22 activates the word line 7 (WL0) connected to the memory cell 2(0) and the word line 7 (WL1) connected to the memory cell 2(2) using the address decoding circuit 20.

Further, the address signals $A_0$ and $A_1$ are also inputted into the sub-memory cell array selecting circuit 21. In response to the address signal $A_0$, the sub-memory cell array selecting circuit 21 selects the sub-memory cell array selecting signal line 9A (SSL0), and activates the switching transistors 801 and 803 of the switching circuits 8A(0) and 8B(0). The sub-memory cell array selecting signal line 9B (SSL1) is not selected. The switching transistors 802 and 804 of the switching circuits 80A(0) and 80B(0) are de activated. Therefore, the local bit line 5A(LB0) is connected to the global bit line 6A (GB0), and the local bit line 5B(LB1) is connected to the global bit line 6B (GB1), so that the sub-memory cell array 3(0) is activated. In short, the memory cell 2(0) of the sub-memory cell array 3(0) is connected to the read/write circuit 10(0) via the local bit lines 5A (LB0) and 5B (LB 1) and the global bit lines 6A(GB0) and 6B(GB1).

In response to the address signal $A_1$, the sub-memory cell array selecting circuit 21 does not select the sub-memory cell array selecting signal line 9A(SSL2), de-activates the switching transistors 801 and 803, selects the sub-memory cell array selecting signal line 9B (SSL3), and activates the switching transistors 802 and 804 of the switching circuits 80A(2) and 80B(2). Therefore, the local bit line 5A(LB0) of the sub-memory cell array 3(2) is connected to the global bit line 6A (GB2), and the local bit line 5B(LB1) of the sub-memory cell array 3(2) is connected to the global bit line 6B (GB3), so that the sub-memory cell array 3(2) is activated. In short, the memory cell 2(2) of the sub-memory cell array 3(3) is connected to the read/write circuit 10(1) via the local bit lines 5A (LB0) and 5B (LB 1) and the global bit lines 6A(GB2) and 6B(GB3).

The data are transferred from the CPU bus 33, and written by the read/write circuit 10(0) into to the memory cell 2(0) of the sub-memory cell array 3(0). In addition, data are transferred from the system bus 34, and written by the read/write circuit 10(1) into to the memory cell 2(2) of the sub-memory cell array 3(2).

(2) Data Reading

The data are read as follows. The memory cell 2(0) of the sub-memory cell array 3(0) is selected. The data stored in the memory cell 2(0) are read and amplified by the read/write circuit 10(0). Then, the data are transferred to the CPU bus 33. At the same time, the memory cell 2(2) of the sub-memory cell array 3(2) is selected. The data stored in the memory cell 2(2) are read and amplified by the read/write circuit 10(1). Then, the data are transferred to the system bus 34.

(3) Accessing the Same Memory Cell in Response to Address

When both the address signals $A_0$ and $A_1$ selects the same memory cell 2 of the same sub-memory cell array 3, the memory cell 2 is preferentially selected in response to the address signal $A_0$ from the CPU bus address 31 by the arbiter circuit 22, and the data are written into and read from the selected memory cell 2. This operation is identical to that of the semiconductor memory 1 of the first embodiment.

The semiconductor memory 1 of the second embodiment is not only as advantageous and effective as the semiconductor memory 1 of the first embodiment but also reduces access restriction on the memory cells 2 and improve access efficiency because the data can be written into and read from memory cells 2 of different sub-memory cell arrays 3 on a pair of global bit lines 6A and 6B.

[System Configuration of Semiconductor Integrated Circuit and Semiconductor Mounted Device]

Figure 7:
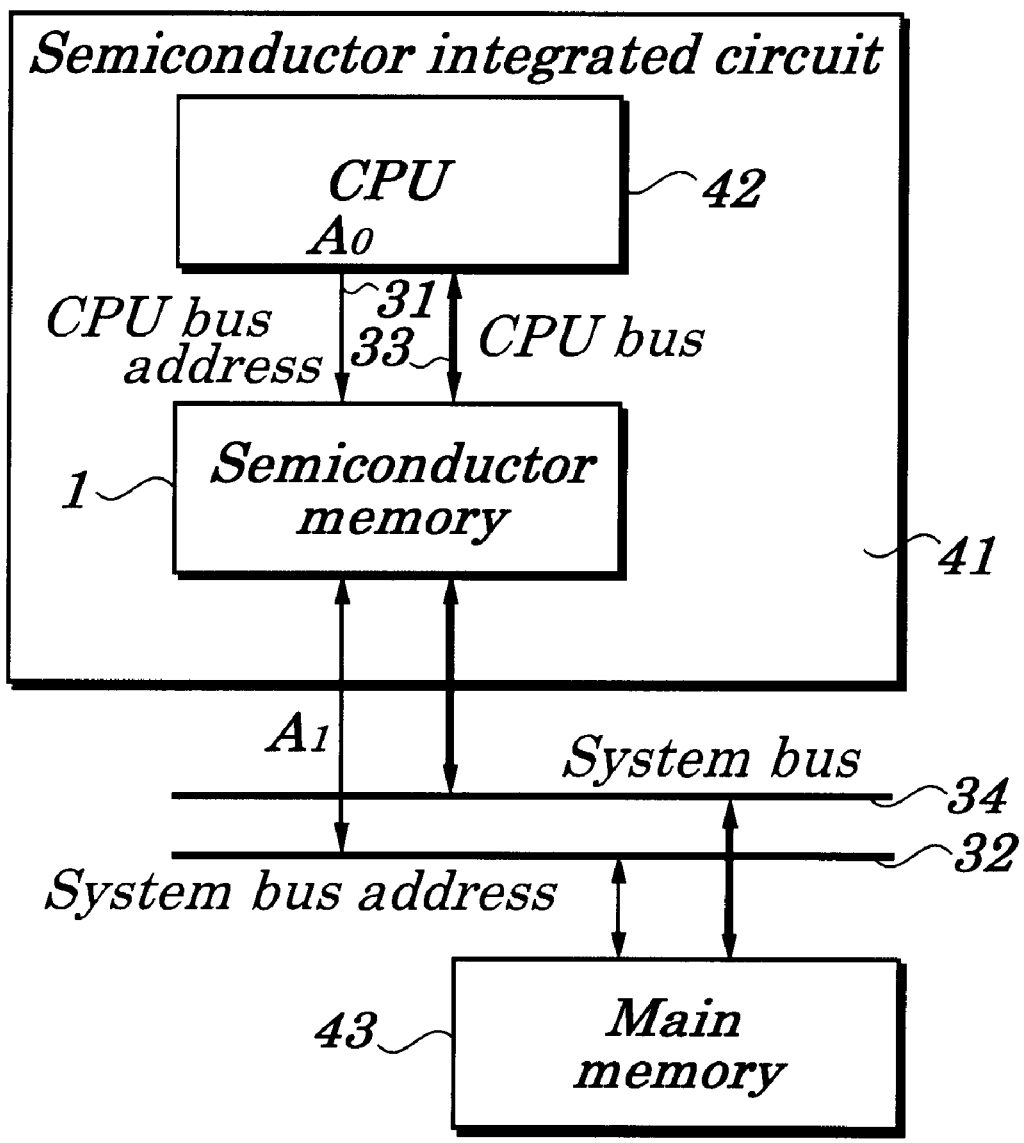
FIG. 7 is a block diagram of a semiconductor integrated circuit including the semiconductor memory according to the first embodiment, and peripheral elements of the semiconductor integrated circuit.

In the second embodiment, a semiconductor integrated circuit 40 includes the foregoing semiconductor memory 1 which is integrated on the semiconductor substrate 41 shown in FIG. 7.

Further, a semiconductor mounted device 50 includes the foregoing semiconductor memory 1 which is mounted on the system board 51 shown in FIG. 8.

(Third Embodiment of the Invention)

The third embodiment relates a semiconductor memory 1, a semiconductor integrated circuit 40 and a semiconductor mounted device 50, in which a selecting circuit and read/write circuits are provided at opposite ends of memory cell arrays 4.

[System Configuration of Semiconductor Memory]

Figure 11:
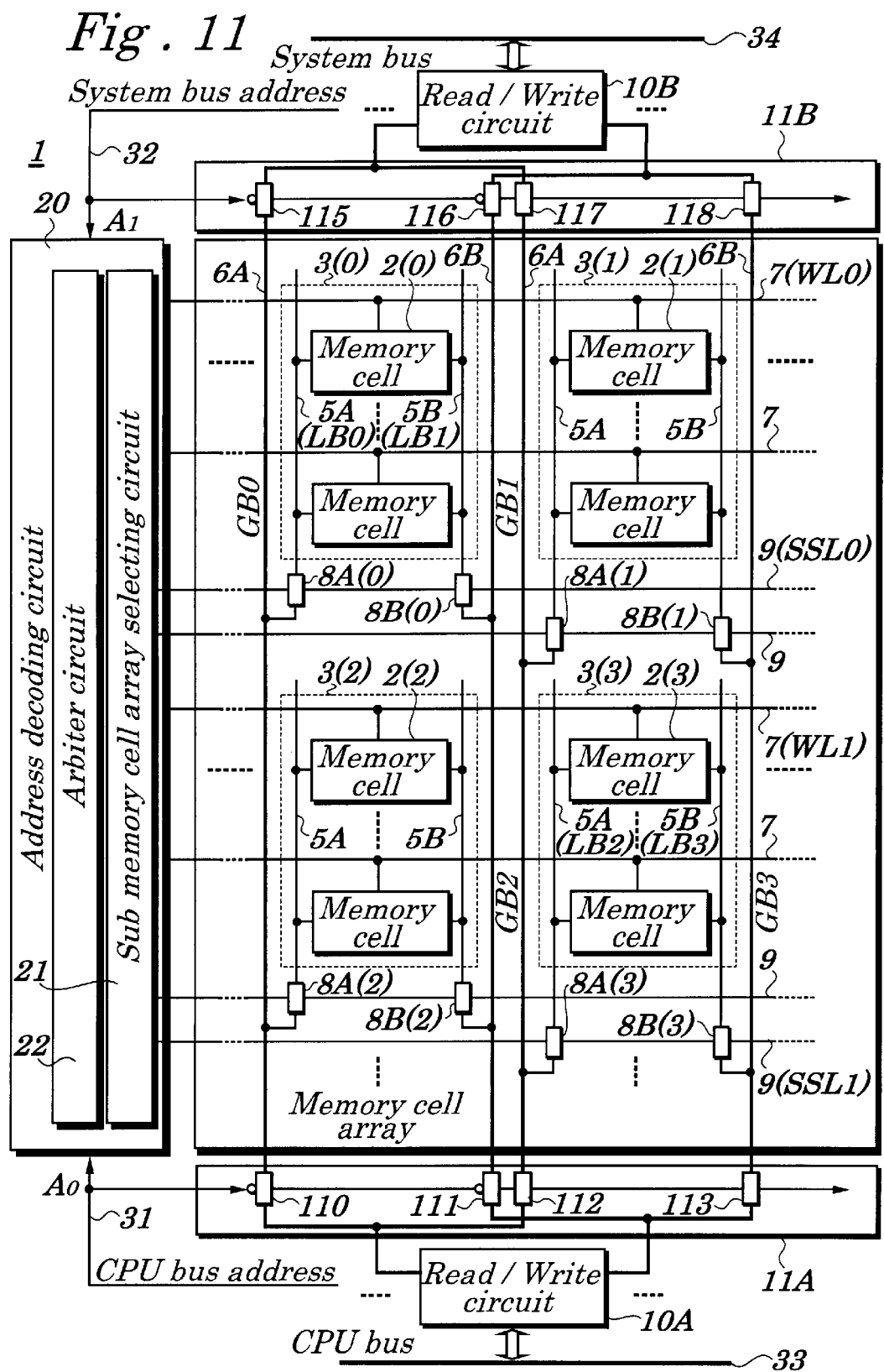
FIG. 11 is a block diagram of a semiconductor memory according to a third embodiment of the invention.

Referring to FIG. 11, the semiconductor memory 1 comprises: a plurality of sub-memory cell arrays 3 each of which is constituted by a plurality of memory cells 2 arranged in a row; a memory cell array 4 constituted by the sub-memory cell arrays 3 arranged in the row and column; a pair of local bit lines 5A and 5B connected in parallel to a plurality of the memory cells 2 in the sub-memory cell arrays 3; a plurality of word lines 7 connected to the memory cells 2 in the sub-memory cell arrays 3; a pair of global bit lines 6A and 6B connected in parallel to the local bit lines 5A and 5B in the sub-memory cell arrays 3 arranged in the row via switching circuits 8A and 8B, and arranged in the column; a read/write circuit 10A connected to one end each (shown at a lower part in FIG. 11) of the global bit lines 6A and 6B, and reading and writing information from and into the memory cells 2; a read/write circuit 10B connected to the other end each (shown at an upper part in FIG. 11) of the global bit lines 6A and 6B, and reading and writing information from and into the memory cells 2; a selecting circuit 11A for selecting the read/write circuit 10A on the basis of an address signal $A_0$ from a CPU bus address 31; a selecting circuit 11B for selecting the read/write circuit 10B on the basis of an address signal $A_1$ from a system bus address 32; a sub-memory cell array selecting circuit 21 connected to the switching circuits 8A and 8B, decoding the address signals $A_0$ and $A_1$, selecting a sub-memory cell array 3 on a pair of the global bit lines 6A and 6B connected to the read/write circuit 10A, and selecting another sub-memory cell array 3 on a pair of the global bit lines 6A and 6B connected to the read/write circuit 10B; and an address decoding circuit 20 decoding the address signals $A_0$ and $A_1$, and activating the word line 7 connected to a memory cell 2 of one of sub-memory cell arrays 3 and the word line 7 connected to another memory cell 2 of another sub-memory cell array.

The read/write circuit 10A is at the lower side of the memory cell array 4 while the read/write circuit 10B is at the upper side of the memory cell array 4. These read/write circuits 10A and 10B are connected to the CPU bus 33 and the system bus 34, respectively.

The selecting circuit 11A is positioned between the read/write circuit 10A and the lower side of the memory cell array 4, and is operated in response to the address signal $A_0$ from the CPU bus address 31. The selecting circuit 11B is positioned between the read/write circuit 10B and the upper side of the memory cell array 4, and is operated in response to the address signal $A_1$ from the system bus address 32.

The selecting circuit 11A includes transfer gate circuits 110 and 111 for selectively conducting one end each of a pair of global bit lines 6A(GB0) and 6B(GB1) and the read/write circuit 10A, and transfer gate circuits 112 and 113 for selectively conducting one end each of a pair of global bit lines 6A(GB2) and 6B(GB3) of the same bit and the read/write circuit 10A. The transfer gate circuits 110 and 111 and the transfer gate circuits 112 and 113 are alternately activated and de-activated in response to the address signal $A_0$ from the CPU bus address 31.

The selecting circuit 11B includes transfer gate circuits 115 and 116 for selectively conducting another end each of a pair of global bit lines 6A(GB0) and 6B(GB1) and the read/write circuit 10B, and transfer gate circuits 117 and 118 for selectively connecting another end each of a pair of global bit lines 6A(GB2) and 6B(GB3) of the same bit and the read/write circuit 10B. The transfer gate circuits 115 and 116 and the transfer gate circuits 117 and 118 are alternately activated and de-activated in response to the address signal $A_1$ from the system bus address 32.

The semiconductor memory 1 of this embodiment is substantially identical to the semiconductor memory 1 of the first embodiment except for the foregoing respect.

[Data Writing and Reading in Semiconductor Memory]

The following describe how data are written into and read from the semiconductor memory 1 as shown in FIG. 11. It is assumed here that the data are written into and read from the memory cell 2(0) via a pair of global bit lines 6A(GB0) and 6B(GB1) in response to the address signal $A_0$ from the CPU bas address 31, and that the data are written into and read from the memory cell 2(3) in response to the address signal $A_1$ from the system bus address 32. Further, these data writing and reading are simultaneously performed.

(1) Data Writing

First of all, the address signal $A_0$ is inputted into the address decoding circuit 20 from the CPU bus address 31 while the address signal $A_1$ is inputted into the decoding circuit 20 from the system bus address 32. At the same time, both the address signals $A_0$ and $A_1$ are inputted into the arbiter circuit 22.

When the address signal $A_0$ selects the memory cell 2(0) while the address signal $A_1$ selects the memory cell 2(3), the arbiter circuit 22 judges that both of the memory cells 2(0) and 2(3) have different addresses and are accessible. Therefore, the arbiter circuit 22 activates the word line 7 (WL0) connected to the memory cell 2(0), and the word line 7 (WL1) connected to the memory cell 2(3).

Further, the address signals $A_0$ and $A_1$ are also inputted into the sub-memory cell array selecting circuit 21. In response to the address signal $A_0$, the sub-memory cell array selecting circuit 21 selects the sub-memory cell array selecting signal line 9A (SSL0), and activates the switching circuits 8A(0) and 8B(0). Therefore, the local bit line 5A(LB0) is connected to the global bit line 6A (GB0), and the local bit line 5B(LB1) is connected to the global bit line 6B (GB1), so that the sub-memory cell array 3(0) is activated. Further, the transfer gate circuits 110 and 111 are activated in response to the address signal $A_0$ while the transfer gate circuits 115 and 116 are de activated in response to the address signal $A_1$. In short, the memory cell 2(0) of the sub-memory cell array 3(0) is connected to the read/write circuit 10A via the local bit lines 5A (LB0) and 5B (LB1) and the global bit lines 6A(GB0) and 6B(GB1).

In response to the address signal $A_1$, the sub-memory cell array selecting circuit 21 selects the sub-memory cell array selecting signal line 9 (SSL1), and activates the switching circuits 8A(3) and 8B(3). Therefore, the local bit line 5A(LB2) of the sub-memory cell array 3 is connected to the global bit line 6A (GB2), and the local bit line 5B(LB3) is connected to the global bit line 6B (GB3), so that the sub-memory cell array 3(3) is activated. Further, the transfer gate circuits 112 and 113 are de-activated in response to the address signal $A_0$, while the transfer gate circuits 117 and 118 are activated in response to the address signal $A_1$. In short, the memory cell 2(3) of the sub-memory cell array 3(3) is connected to the read/write circuit 10B via the local bit lines 5A (LB2) and 5B (LB3) and the global bit lines 6A(GB2) and 6B(GB3).

The data are transferred from the CPU bus 33, and written by the read/write circuit 10A into to the memory cell 2(0) of the sub-memory cell array 3(0). In addition, the data are transferred from the system bus 34, and written by the read/write circuit 10B into to the memory cell 2(3) of the sub-memory cell array 3(3).

The data are simultaneously written into the memory cells 2(0) and 2(1) of the sub-memory cell arrays 3(0) and 3(1) as described above.

(2) Data Reading

The data are read as follows. The memory cell 2(0) of the sub-memory cell array 3(0) is selected. The data stored in the memory cell 2(0) are read and amplified by the read/write circuit 10A. Then, the data are transferred to the CPU bus 33. At the same time, the memory cell 2(3) is selected. The data stored in the memory cell 2(3) are read and amplified by the read/write circuit 10B. Then, the data are transferred to the system bus 34.

(3) Accessing the same Memory Cell in Response to Address

When both the address signals $A_0$ and $A_1$ selects the same memory cell 2 of the same sub-memory cell array 3, the memory cell 2 is preferentially selected in response to the address signal $A_0$ from the CPU bus address 31 by the arbiter circuit 22, and the data are written into and read from the selected memory cell 2.

The semiconductor memory 1 of the third embodiment is as advantageous and effective as the semiconductor memory 1 of the first embodiment.

In the semiconductor memory 1 of this embodiment, the read/write circuit 10A connected to the CPU bus 33 is positioned at the lower side of the memory cell array 4 while the read/write circuit 10B connected to the system bus 34 is positioned at the upper side of the memory cell array 4. Therefore, either the read/write circuit 10A or 10B can be provided for two pairs of global bit lines 6A and 6B (or two pairs of local bit lines 5A and 5B) in the column. In other words, the relatively large read/write circuit 10A or 10B can be provided for the memory cells 2 which are arranged in accordance with a strict rule. This is effective in improving integration of the semiconductor memory 1.

[System Configuration of Semiconductor Integrated Circuit and Semiconductor Mounted Device ]

In the third embodiment, a semiconductor integrated circuit 40 includes the semiconductor memory 1 of the first embodiment which is integrated on the semiconductor substrate 41 shown in FIG. 7.

Further, a semiconductor mounted device 50 includes the semiconductor memory 1 of the first embodiment which is mounted on the system board 51 shown in FIG. 8.

(Other Embodiments)

The invention has been described in detail with particular reference to the embodiments of the invention, but it will be understood that variations and modifications can be effected within the spirit and scope of the invention as set forth in the claims.

The invention has been described with respect to the semiconductor memory 1 as an SRAM. Alternatively, the semiconductor memory 1 may be a DRAM (dynamic random access memory), a ROM, an EPROM (erasable programmable read only memory), or an EEPROM (electrically erasable programmable read only memory).

According to the invention, a plurality of memory cells can be simultaneously accessed in response to the address signals from a plurality of address buses, so that it is not necessary to provide data bus wirings in order to connect a plurality of interfaces having a bank structure. As a result, the semiconductor memory can be further integrated, and system operation can be accelerated.

The semiconductor memory can assure improved system characteristics.

The semiconductor integrated circuit can assure improved system characteristics.

The semiconductor mounted device circuit can assure improved system characteristics.

What is claimed is:

1. A semiconductor memory comprising:
   a plurality of sub-memory cell arrays each of which is constituted by a plurality of memory cells arranged in a first direction;
   a memory cell array constituted by said sub-memory cell arrays arranged in the first direction and a second direction traversing the first direction;
   a plurality of local bit lines connected in parallel to a plurality of said memory cells in said sub-memory arrays;
   a plurality of word lines connected to said memory cells in said sub-memory arrays;
   a plurality of global bit lines connected in parallel to said local bit lines in said sub-memory cell arrays arranged in the first direction via switching circuits, and arranged in the second direction;
   a plurality of read/write circuits connected to said global bit lines, and reading and writing information from and into said memory cells;
   a selecting circuit selecting a first read/write circuits on the basis of a first address signal from a first bus and selecting a second read/write circuits on the basis of a second address signal from a second bus;
   a sub-memory cell array selecting circuit connected to said switching circuits, decoding said first and second address signals, and selecting a first sub-memory cell array on a first global bit line connected to said first read/write circuit, and a second sub-memory cell array on a second global bit line connected to said second read/write circuits; and
   an address decoding circuit decoding said first and second address signals, and activating a first word line connected to a memory cell of said first sub-memory cell array and a second word line connected to another memory cell of said second sub-memory cell array.

2. The semiconductor memory according to claim 1, wherein said selecting circuit selects said first and second read/write circuits which are adjacent to each other in the second direction and are connected to said first and second global bit lines constituting the same bit.

3. The semiconductor memory according to claim 1, wherein said selecting circuit includes at least a first multiplexing circuit connecting said first or second read/write circuit and said first bus in response to said first address signal, and a second multiplexing circuit connecting said first or second read/write circuit and said second bus in response to said second address signal.

4. The semiconductor memory according to claim 1, wherein: said global bit lines extend in the first direction and are equally spaced in the second direction; said local bit lines are arranged substantially in parallel to said global bit lines corresponding thereto; and said word lines extend in the second direction and are equally spaced in the first direction.

5. The semiconductor memory according to claim 1, wherein said sub-memory cell array selecting circuit and said switching circuits are connected by a sub-memory cell array selecting signal line which is substantially in parallel to said word lines.

6. The semiconductor memory according to claim 1, wherein: said read/write circuits are arranged along a first side which extends in the second direction of said memory cell arrays; said selecting circuit is arranged along said first side via said read/write circuits; said address decoding circuit is arranged along a second side extending in said first direction of said memory cell array; and said sub-memory cell array selecting circuit extends along said second side.

7. The semiconductor memory according to claim 1, wherein: said address decoding circuit includes at least a first decoding circuit decoding said first address signal; a second decoding circuit decoding said second address signal; and a word line driving circuit activating said word lines on the basis of logical addition (OR) of outputs of said first and second decoding circuits.

8. The semiconductor memory according to claim 1, further comprising an arbiter circuit which selects only one of said sub-memory cell arrays in response to said first address signal when said first and second address signals arrive at the same sub-memory cell array, and selecting both of sub-memory cell arrays when said first and second address signals arrive at different sub-memory cell arrays.

9. The semiconductor memory according to claim 1, wherein said first bus is a central processing unit bus address, and said second bus is a system bus address.

10. The semiconductor memory according to claim 1, wherein each of said memory cells is a static random access memory cell which is positioned at an intersection of a pair of local bit lines to which reverse signals are inputted and a word line, and which includes a flip-flop circuit having a pair of input/output terminals, and a first cell selecting transistor which connects one of said input/output terminals to one of said local bit lines and a second cell selecting transistor which connects the other local bit line and the other input/output terminal, said first and second cell selecting transistors being connected to said word lines.

11. A semiconductor memory comprising:
a plurality of sub-memory cell arrays each of which is constituted by a plurality of memory cells arranged in a first direction;
a memory cell array constituted by said sub-memory cell arrays arranged in the first direction and a second direction traversing the first direction;
a plurality of local bit lines connected in parallel to a plurality of said memory cells in said sub-memory arrays;
a plurality of word lines connected to said memory cells in said sub-memory arrays;
a plurality of global bit lines extending along said local bit lines in said sub-memory cell arrays arranged in the first direction, and arranged in the second direction;
a plurality of switching circuits provided to said global bit lines, and connected to said local bit line of a first global bit line or a second global bit line which is adjacent in the second direction;
a plurality of read/write circuits connected to said global bit lines, and reading and writing information from and into said memory cells;
a sub-memory cell array selecting circuit connected to said switching circuits, decoding said first and second address signals, and selecting a first sub-memory cell arrays on said first global bit lines connected to a first read/write circuit, and a second sub-memory cell array on said second global bit line connected to a second read/write circuits, or said sub-memory cell array selecting circuit selecting a first sub-memory cell array on said first global bit line, and a second sub-memory cell array on said first global bit line; and
an address decoding circuit decoding said first and second address signals, and activating a first word line connected to a memory cell of said first sub-memory cell array and a second word line connected to another memory cell of said second sub-memory cell array.

12. The semiconductor memory according to claim 11, wherein each of said switching circuits includes a first transistor which connects said local bit line and said first global bit line and is made conductive by said sub-memory cell array selecting circuit, and a second transistor which connects said local bit lines and said second global bit line and is made conductive by said sub-memory cell array selecting circuit.

13. A semiconductor memory comprising:
a plurality of sub-memory cell arrays each of which is constituted by a plurality of memory cells arranged in a first direction;
a memory cell array constituted by said sub-memory cell arrays arranged in the first direction and a second direction traversing the first direction;
a plurality of local bit lines connected in parallel to a plurality of said memory cells in said sub-memory arrays;
a plurality of word lines connected to said memory cells in said sub-memory arrays;
a plurality of global bit lines connected in parallel to said local bit lines in said sub-memory cell arrays arranged in the first direction via switching circuits, and arranged in the second direction;
a first read/write circuit connected to one end each of said global bit lines, and reading and writing information from and into said memory cells;
a second read/write circuit connected to the other end each of said global bit lines, and reading and writing information from and into said memory cells;
a first selecting circuit selecting a first one of said read/write circuits on the basis of a first address signal from a first bus;
a second selecting circuit selecting a second read/write circuit on the basis of a second address signal from a second bus;
a sub-memory cell array selecting circuit connected to said switching circuits, decoding said first and second address signals, and selecting a first sub-memory cell array on a first global bit line connected to said first read/write circuit, and a second sub-memory cell array on a second global bit line connected to said second read/write circuit; and
an address decoding circuit decoding said first and second address signals, and activating a first word line connected to a memory cell of said first sub-memory cell array and a second word line connected to another memory cell of said second sub-memory cell array.

14. The semiconductor memory according to claim 13, wherein said first selecting circuit is a transfer gate circuit for connecting said first global bit line and said first read/write circuit, and said second selecting circuit is a transfer gate circuit for connecting said second global bit line and said second read/write circuit.

15. A semiconductor integrated circuit comprising:
a semiconductor substrate;
a central processing unit mounted on said semiconductor substrate;
a central processing unit bus connected to said central processing unit and inputting and outputting data;
a central processing unit bus address connected to said central processing unit and transmitting a first address signal; and
a semiconductor memory connected to said central processing unit bus and said central processing unit bus address and being connectable to an external system bus and an external system bus address which transmits a second address signal, said semiconductor memory including:
  a plurality of sub-memory cell arrays each of which is constituted by a plurality of memory cells arranged in a first direction;
  a memory cell array constituted by said sub-memory cell arrays arranged in the first direction and a second direction traversing the first direction;
  a plurality of local bit lines connected in parallel to a plurality of said memory cells in said sub-memory arrays;
  a plurality of word lines connected to said memory cells in said sub-memory arrays;
  a plurality of global bit lines connected in parallel to said local bit lines in said sub-memory cell arrays arranged in the first direction via switching circuits, and arranged in the second direction;
  a plurality of read/write circuits connected to said global bit lines, and reading and writing information from and into said memory cells;
  a selecting circuit selecting a first read/write circuits on the basis of a first address signal from a first bus and selecting a second read/write circuits on the basis of a second address signal from a second bus;
  a sub-memory cell array selecting circuit connected to said switching circuits, decoding said first and second address signals, and selecting a first sub-memory cell array on a first global bit line connected to said first read/write circuit, and a second sub-memory cell array on a second global bit line connected to said second read/write circuits; and
  an address decoding circuit decoding said first and second address signals, and activating a first word line connected to a memory cell of said first sub-memory cell array and a second word line connected to another memory cell of said second sub-memory cell array.

16. A semiconductor integrated circuit comprising:
a semiconductor substrate;
a central processing unit mounted on said semiconductor substrate;
a central processing unit bus connected to said central processing unit and inputting and outputting data;
a central processing unit bus address connected to said central processing unit and transmitting a first address signal; and
a semiconductor memory connected to said central processing unit bus and said central processing unit bus address and being connectable to an external system bus and an external system bus address which transmits a second address signal, said semiconductor memory including:
  a plurality of sub-memory cell arrays each of which is constituted by a plurality of memory cells arranged in a first direction;
  a memory cell array constituted by said sub-memory cell arrays arranged in the first direction and a second direction traversing the first direction;
  a plurality of local bit lines connected in parallel to a plurality of said memory cells in said sub-memory arrays;
  a plurality of word lines connected to said memory cells in said sub-memory arrays;
  a plurality of global bit lines extending along said local bit lines in said sub-memory cell arrays arranged in the first direction, and arranged in the second direction;
  a plurality of switching circuits provided to said global bit lines, and connected to said local bit line of a first global bit line or a second global bit line which is adjacent in the second direction;
  a plurality of read/write circuits connected to said global bit lines, and reading and writing information from and into said memory cells;
  a sub-memory cell array selecting circuit connected to said switching circuits, decoding said first and second address signals, and selecting a first sub-memory cell arrays on said first global bit lines connected to a first read/write circuit, and a second sub-memory cell array on said second global bit line connected to a second read/write circuits, or said sub-memory cell array selecting circuit selecting a first sub-memory cell array on said first global bit line, and a second sub-memory cell array on said first global bit line; and
  an address decoding circuit decoding said first and second address signals, and activating a first word line connected to a memory cell of said first sub-memory cell array and a second word line connected to another memory cell of said second sub-memory cell array.

17. A semiconductor integrated circuit comprising:
a semiconductor substrate;
a central processing unit mounted on said semiconductor substrate;
a central processing unit bus connected to said central processing unit and inputting and outputting data;
a central processing unit bus address connected to said central processing unit and transmitting a first address signal; and
a semiconductor memory connected to said central processing unit bus and said central processing unit bus address and being connectable to an external system bus and an external system bus address which transmits a second address signal, said semiconductor memory including:
  a plurality of sub-memory cell arrays each of which is constituted by a plurality of memory cells arranged in a first direction;
  a memory cell array constituted by said sub-memory cell arrays arranged in the first direction and a second direction traversing the first direction;
  a plurality of local bit lines connected in parallel to a plurality of said memory cells in said sub-memory arrays;

a plurality of word lines connected to said memory cells in said sub-memory arrays;

a plurality of global bit lines connected in parallel to said local bit lines in said sub-memory cell arrays arranged in the first direction via switching circuits, and arranged in the second direction;

a first read/write circuit connected to one end each of said global bit lines, and reading and writing information from and into said memory cells;

a second read/write circuit connected to the other end each of said global bit lines, and reading and writing information from and into said memory cells;

a first selecting circuit selecting a first one of said read/write circuits on the basis of a first address signal from a first bus;

a second selecting circuit selecting a second read/write circuit on the basis of a second address signal from a second bus;

a sub-memory cell array selecting circuit connected to said switching circuits, decoding said first and second address signals, and selecting a first sub-memory cell array on a first global bit line connected to said first read/write circuit, and a second sub-memory cell array on a second global bit line connected to said second read/write circuit; and an address decoding circuit decoding said first and second address signals, and activating a first word line connected to a memory cell of said first sub-memory cell array and a second word line connected to another memory cell of said second sub-memory cell array.

18. A semiconductor mounted device comprising:

a system board;

a central processing unit mounted on said system board;

a main memory mounted on said system board;

a central processing unit bus connected to said central processing unit and inputting and outputting data;

a central processing unit bus address connected to said central processing unit and transmitting a first address signal;

a system bus connected to said main memory and inputting and outputting data;

a system bus address connected to said main memory and transmitting a second address signal; and a semiconductor memory connected to said central processing unit bus, said central processing unit bus address, said system bus and said system bus address and mounted on a system board, said semiconductor memory including:

a plurality of sub-memory cell arrays each of which is constituted by a plurality of memory cells arranged in a first direction;

a memory cell array constituted by said sub-memory cell arrays arranged in the first direction and a second direction traversing the first direction;

a plurality of local bit lines connected in parallel to a plurality of said memory cells in said sub-memory arrays;

a plurality of word lines connected to said memory cells in said sub-memory arrays;

a plurality of global bit lines connected in parallel to said local bit lines in said sub-memory cell arrays arranged in the first direction via switching circuits, and arranged in the second direction;

a plurality of read/write circuits connected to said global bit lines, and reading and writing information from and into said memory cells;

a selecting circuit selecting a first read/write circuits on the basis of a first address signal from a first bus and selecting a second read/write circuits on the basis of a second address signal from a second bus;

a sub-memory cell array selecting circuit connected to said switching circuits, decoding said first and second address signals, and selecting a first sub-memory cell array on a first global bit line connected to said first read/write circuit, and a second sub-memory cell array on a second global bit line connected to said second read/write circuits; and an address decoding circuit decoding said first and second address signals, and activating a first word line connected to a memory cell of said first sub-memory cell array and a second word line connected to another memory cell of said second sub-memory cell array.

19. A semiconductor mounted device comprising:

a system board;

a central processing unit mounted on said system board;

a main memory mounted on said system board;

a central processing unit bus connected to said central processing unit and inputting and outputting data;

a central processing unit bus address connected to said central processing unit and transmitting a first address signal;

a system bus connected to said main memory and inputting and outputting data;

a system bus address connected to said main memory and transmitting a second address signal; and a semiconductor memory connected to said central processing unit bus, said central processing unit bus address, said system bus and said system bus address and mounted on a system board, said semiconductor memory including:

a plurality of sub-memory cell arrays each of which is constituted by a plurality of memory cells arranged in a first direction;

a memory cell array constituted by said sub-memory cell arrays arranged in the first direction and a second direction traversing the first direction;

a plurality of local bit lines connected in parallel to a plurality of said memory cells in said sub-memory arrays;

a plurality of word lines connected to said memory cells in said sub-memory arrays;

a plurality of global bit lines extending along said local bit lines in said sub-memory cell arrays arranged in the first direction, and arranged in the second direction;

a plurality of switching circuits provided to said global bit lines, and connected to said local bit line of a first global bit line or a second global bit line which is adjacent in the second direction;

a plurality of read/write circuits connected to said global bit lines, and reading and writing information from and into said memory cells;

a sub-memory cell array selecting circuit connected to said switching circuits, decoding said first and second address signals, and selecting a first sub-memory cell arrays on said first global bit lines connected to a first read/write circuit, and a second sub-memory cell array on said second global bit line connected to a second read/write circuits, or said sub-memory cell array selecting circuit selecting a first sub-memory cell array on said first global bit line, and a second sub-memory cell array on said first global bit line; and an address decoding circuit decoding said first and second address signals, and activating a first word line connected to a memory cell of said first sub-memory cell array and a second word line connected to another memory cell of said second sub-memory cell array.

20. A semiconductor-mounted device comprising:

a system board;

a central processing unit mounted on said system board;

a main memory mounted on said system board;

a central processing unit bus connected to said central processing unit and inputting and outputting data;

a central processing unit bus address connected to said central processing unit and transmitting a first address signal;

a system bus connected to said main memory and inputting and outputting data;

a system bus address connected to said main memory and transmitting a second address signal; and a semiconductor memory connected to said central processing unit bus and said central processing unit bus address and mounted on a system board, said semiconductor memory including:

a plurality of sub-memory cell arrays each of which is constituted by a plurality of memory cells arranged in a first direction;

a memory cell array constituted by said sub-memory cell arrays arranged in the first direction and a second direction traversing the first direction;

a plurality of local bit lines connected in parallel to a plurality of said memory cells in said sub-memory arrays;

a plurality of word lines connected to said memory cells in said sub-memory arrays;

a plurality of global bit lines connected in parallel to said local bit lines in said sub-memory cell arrays arranged in the first direction via switching circuits, and arranged in the second direction;

a first read/write circuit connected to one end each of said global bit lines, and reading and writing information from and into said memory cells;

a second read/write circuit connected to the other end each of said global bit lines, and reading and writing information from and into said memory cells;

a first selecting circuit selecting a first one of said read/write circuits on the basis of a first address signal from a first bus;

a second selecting circuit selecting a second read/write circuit on the basis of a second address signal from a second bus;

a sub-memory cell array selecting circuit connected to said switching circuits, decoding said first and second address signals, and selecting a first sub-memory cell array on a first global bit line connected to said first read/write circuit, and a second sub-memory cell array on a second global bit line connected to said second read/write circuit; and an address decoding circuit decoding said first and second address signals, and activating a first word line connected to a memory cell of said first sub-memory cell array and a second word line connected to another memory cell of said second sub-memory cell array.

* * * * *